United States Patent [19]
Fukui et al.

[11] Patent Number: 5,663,032
[45] Date of Patent: Sep. 2, 1997

[54] PHOTOSENSITIVE COMPOSITION CONTAINING PHOTOSENSITIVE AND HEAT DEVELOPABLE ELEMENT AND POLYMER ELEMENT AND IMAGE-FORMING METHOD UTILIZING THE SAME

[75] Inventors: Tetsuro Fukui, Kawasaki; Masato Katayama, Yokohama; Kozo Arahara; Hiroshi Fukumoto, both of Kawasaki; Yoshio Takasu, Tama; Kenji Kagami; Akihiro Mouri, both of Atsugi; Kazuo Isaka, Tokyo; Kyo Miura, Yokohama, all of Japan

[73] Assignees: Canon Kabushiki Kaisha; Oriental Photo Industrial Co., Ltd., both of Tokyo, Japan

[21] Appl. No.: 180,460

[22] Filed: Jan. 12, 1994

Related U.S. Application Data

[63] Continuation of Ser. No. 912,576, Jul. 13, 1992, abandoned, which is a continuation of Ser. No. 532,128, Jun. 4, 1990, abandoned, which is a continuation of Ser. No. 302,270, Jan. 27, 1989, abandoned.

[30] Foreign Application Priority Data

| | | | |
|---|---|---|---|
| Jan. 29, 1988 | [JP] | Japan | 63-017155 |
| Jan. 30, 1988 | [JP] | Japan | 63-018502 |
| Jul. 25, 1988 | [JP] | Japan | 63-183441 |
| Oct. 7, 1988 | [JP] | Japan | 63-251958 |
| Jan. 9, 1989 | [JP] | Japan | 1-001153 |

[51] Int. Cl.$^6$ ............................................. G03C 8/02
[52] U.S. Cl. ....................... 430/203; 430/253; 430/281.1; 430/328; 430/330
[58] Field of Search ...................... 430/281, 253, 430/328, 330, 203, 611, 281.1

[56] References Cited

U.S. PATENT DOCUMENTS

| | | | |
|---|---|---|---|
| 3,667,958 | 6/1972 | Evens | 430/617 |
| 3,751,249 | 8/1973 | Hiller | 430/617 |
| 3,874,947 | 4/1975 | Hayakawa et al. | 96/51 |

(List continued on next page.)

FOREIGN PATENT DOCUMENTS

| | | | |
|---|---|---|---|
| 0174634 | 3/1986 | European Pat. Off. | G03C 1/68 |
| 202490 | 11/1986 | European Pat. Off. | |

(List continued on next page.)

OTHER PUBLICATIONS

*Light Sensitive Systems*, J. Kosar, John Wiley and Sons, Inc., NY, 1965 p. 170.
Chemical Abstracts 89:44310 (1978).

*Primary Examiner*—Christopher D. Rodee
*Attorney, Agent, or Firm*—Fitzpatrick, Cella, Harper & Scinto

[57] ABSTRACT

A photosensitive material comprises a photosensitive composition comprising a photosensitive and heat-developable element and a photopolymerizable element. An imagewise unexposed area on the material is polymerized by imagewise exposure, heating and whole areal exposure. The photosensitive and heat-developable element comprises at least a photosensitive silver halide, an organic silver salt and a reducing agent of the formula

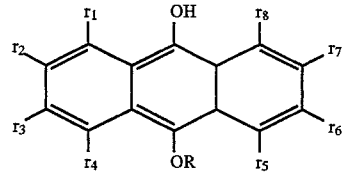

The photopolymerizable element comprises at least a polymerizable polymer precursor and a photopolymerization initiator. An image forming method comprises the steps; subjecting a photosensitive material in the same layer to imagewise exposure and heating to form an image; and subjecting the resultant photosensitive material to whole areal exposure to polymerize and imagewise unexposed or exposed area thereof.

25 Claims, 2 Drawing Sheets

U.S. PATENT DOCUMENTS

| | | | |
|---|---|---|---|
| 4,065,315 | 12/1977 | Yamazaki et al. | 430/281 |
| 4,207,108 | 6/1980 | Hiller | 430/617 |
| 4,558,003 | 12/1985 | Sagawa | 430/617 |
| 4,624,910 | 11/1986 | Takeda | 430/203 |
| 4,629,676 | 12/1986 | Hayakawa | 430/203 |
| 4,649,098 | 3/1987 | Takeda | 430/270 |
| 4,649,103 | 3/1987 | Yabuki et al. | 430/570 |
| 4,753,862 | 6/1988 | Sato et al. | 430/138 |
| 4,764,451 | 8/1988 | Ishikawa | 430/138 |
| 4,783,396 | 11/1988 | Nakamura et al. | 430/617 |
| 4,950,584 | 8/1990 | Komamura et al. | 430/203 |
| 5,041,369 | 8/1991 | Fukui et al. | 430/617 |

FOREIGN PATENT DOCUMENTS

| | | | |
|---|---|---|---|
| 0219087 | 4/1987 | European Pat. Off. | |
| 232721 | 8/1987 | European Pat. Off. | |
| 0330504 | 8/1989 | European Pat. Off. | |
| 1942168 | 3/1970 | Germany | G03C 1/68 |
| 3207064 | 2/1981 | Germany . | |
| 3207064 | 12/1982 | Germany | G03C 1/02 |
| 58-192032 | 11/1983 | Japan . | |
| 59-055429 | 3/1984 | Japan . | |
| 61-75342 | 4/1986 | Japan . | |
| 62-070836 | 4/1987 | Japan . | |
| 62-195639 | 8/1987 | Japan | G03C 1/00 |

(d1)

(d2)

PHOTOSENSITIVE COMPOSITION CONTAINING PHOTOSENSITIVE AND HEAT DEVELOPABLE ELEMENT AND POLYMER ELEMENT AND IMAGE-FORMING METHOD UTILIZING THE SAME

This application is a continuation of application Ser. No. 07/912,576 filed Jul. 13, 1992, now abandoned, which is a continuation of application Ser. No. 07/532,128 filed on Jun. 4, 1990, now abandoned, which is a continuation of application Ser. No. 07/302,270 filed on Jan. 27, 1989, now abandoned.

BACKGROUND OF THE INVENTION

1. Field of the Invention

The present invention relates to a photosensitive composition that forms a polymer image by exposure to light, a photosensitive material comprising the photosensitive composition, and an image forming method which employs the photosensitive material comprising the photosensitive composition. More particularly it is concerned with a photosensitive composition which is highly sensitive and used to form a highly detailed polymer image using a silver halide as a photosensor, a photosensitive material comprising the composition, and with an image forming method using the photosensitive material.

2. Related Background Art

Energies used to form or record an image include light, sound, electricity, magnetism, heat, radiations such as electron rays and X-rays, and chemical energy. Among them, in particular, widely used are light, electricity, heat energy, or a combination of any of these.

For example, the image forming method that employs the combination of light energy with chemical energy includes a silver salt photographic process and a method in which a diazo copying paper is used. The method that employs the combination of light energy with electric energy includes an electrophotographic system. Also, the method that utilizes heat energy includes a method in which a heat-sensitive recording paper or transfer recording paper is used. On the other hand, known as the method that utilizes electric energy is a method in which an electrostatic recording paper, electrothermal recording paper, or electrosensitive recording paper is used.

Of the above image forming methods, the silver salt photographic process can obtain an image having a high resolution. The silver salt photographic process, however, requires the developing and fixing that uses complicated liquid compositions, or the drying treatment of an image (or a print).

Now, development is energetically made on image forming methods that can form an image through a simple processing.

For example, U.S. Pat. No. 4,629,676 teaches a method in which polymerization reaction under dry (thermal) conditions is caused by the photosensitive reaction of silver halide that acts as a trigger, to form an image comprising a polymer.

This method has the advantage that any complicated wet processings are not required, but has had the disadvantage that the polymer formation rate (i.e., polymerization rate of a polymeric compound) is so low that it takes a long time to form the polymer image. Incidentally, this disadvantage arises presumably because of a reaction intermediate (which functions as a polymerization initiator) formed in the course of heating, by the reaction between silver halide and a reduced agent in existence of silver catalyst produced by imagewise exposure, which intermediate is so stable and has so low activity as the polymerization initiator that the polymerization reaction can not proceed so rapidly.

On the other hand, for accelerating the polymerization to cope with this problem, Japanese Unexamined Patent Publication No. 62-70836 discloses a method in which a thermopolymerization initiator is used.

This method comprises forming a latent image comprising silver nuclei produced from silver halide by imagewise exposure, and converting, under heating, a reducing agent into an oxidized product having a polymerization inhibitory power different from that of said reducing agent by utilizing a catalytic action of the above silver nuclei, thereby producing a difference in the polymerization inhibitory power between the reducing agent and the resulting oxidized product and also causing a thermopolymerization reaction utilizing the thermopolymerization initiator, thus forming a polymer image according to the difference in the polymerization inhibitory power.

This method, however, has disadvantage that a good contrast can not be made in the polymer image.

This disadvantage arises presumably because the oxidation-reduction reaction taking place in a latent image portion to form the oxidized product and the polymerization reaction to form the polymer image are allowed to take place in the same heating step, so that these reactions may proceed in a competitive fashion and thus the respective reactions may not proceed with efficiency.

Also, the image formation according to this method is very unstable in that, for example, the areas on which the polymer is formed may turn into exposed areas or unexposed areas even by a slight change in the amount of the reducing agent.

In addition, U.S. Pat. No. 4,649,098 discloses a method in which a reducing agent having a polymerization inhibitory power is brought into an oxidized product by imagewise consumption (at exposed areas) in the course of the developing of silver halide, and at the same time, residual reducing agent enables imagewise inhibition (at unexposed areas) of polymerization reaction, and then light energy is uniformly applied, (whole areal exposure) from the outside to cause photopolymerization at the part which the reducing agent has been consumed, thus forming a polymer image.

The above method has the advantages that it can achieve a high sensitivity in the writing of a latent image since the silver halide is used, and the steps of from the writing for the formation of an image up to the whole areal exposure can be separated efficiency. It, however, is difficult to obtain a polymer image having a sufficient contrast.

More specifically, since the reducing agent used in the above method is in itself a reducing agent that acts as a polymerization initiator and does not to act as the polymerization initiator after the reduction of silver halide, it is necessary for obtaining an image having a good contrast to completely convert the reducing agent at the exposed areas into the oxidized product and also to impart the heat energy in a sufficient amount at the time of developing. However, excessive heating at high temperatures may cause an unintended oxidation-reduction reaction at the unexposed areas, reducing the contrast of the oxidation-reduction image, and eventually making worse the polymer image contrast. On the other hand, moderate heating at the time of developing may conversely not bring the oxidation-reduction reaction to sufficiently proceed at the exposed areas, so that not only the contrast becomes small but also the light energy required upon forming the polymer image must be applied in a sufficient amount. This may further cause an unintended polymerization at the unexposed areas, eventually making worse the polymer image contrast.

The polymer image to be formed according to the methods as described above is an image comprising a polymerized area and an unpolymerized area. For making this polymer image visible and further forming it into a color image, for example, U.S. Pat. No. 4,649,098 and so forth discloses various methods that utilize the difference in physical properties and so forth between the polymerized area and unpolymerized area. For example in one, proposed method in which a treatment is made using a liquid that does not dissolve the polymerized area and dissolves the layer of the unpolymerized area, thereby dissolving and removing the unpolymerized area (i.e., etching); another method which, utilizes the difference in adhesion between the polymerized area and unpolymerized area, a sheet such as plastic film is adhered and thereafter peeled to separate the polymerized area and unpolymerized area under dry conditions (i.e., peeling-apart); in the case where the polymer image is formed into a color image, a method in which a photopolymerizable layer is previously colored with use of a pigment or dye, which is then subjected to the above dissolving (i.e, etching) or peeling (i.e., peeling-apart) to form the color image, or a method in which, utilizing the adhesion at the unpolymerized area, a coloring powder is applied to make selective coloring (i.e., toning or inking), or, utilizing the difference in liquid-permeability between the polymerized area and unpolymerized area, the unpolymerized area is selectively dyed by treating it with a dye solution.

However, no polymer image having a sufficient contrast can be obtained in the conventional polymer image forming methods as discussed above, and hence, even with employment of any of the above methods for making the image visible or forming it into a color image, the visible image and color image which are obtained from such a polymer image can not have any sufficient contrast, and particularly it has been difficult to obtain highly detailed visible image and color image.

SUMMARY OF THE INVENTION

An object of the present invention is to provide a photosensitive composition, a photosensitive material, and an image forming method, that can form in a fast and stable state a polymer image having a good contrast, as compared with the prior art.

Another object of the present invention is to provide a photosensitive composition, a photosensitive material, and an image forming method, that can give a superior resolution and may not cause any color fogging.

The above objects of the present invention can be achieved by the invention described below.

The present invention provides a photosensitive composition, comprising a photosensitive and heat-developable element and a photopolymerizable element, wherein said photosensitive and heat-developable element contains at least one compound selected from the group of compounds represented by the following Formula (I), (II) or (III):

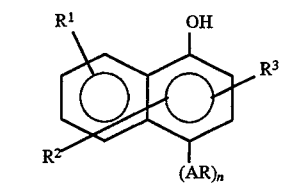

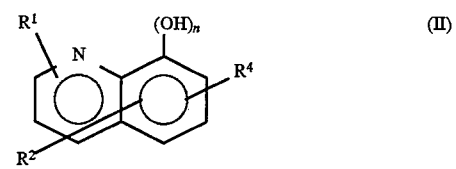

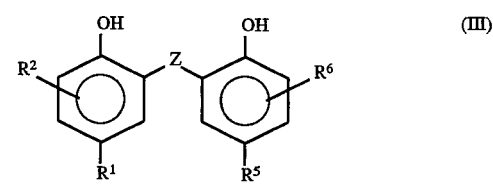

wherein $R^1$, $R^2$, $R^3$, $R^5$ and $R^6$ each represent a hydrogen atom, a halogen atom, a hydroxyl group, a substituted or unsubstituted alkyl group, a substituted or unsubstituted aralkyl group, a substituted or unsubstituted aryl group, an alkoxy group, or a substituted or unsubstituted cycloalkyl group; $R^4$ represents a hydrogen atom, a halogen atom, a substituted or unsubstituted alkyl group, a substituted or unsubstituted aralkyl group, a substituted or unsubstituted aryl group, a substituted or unsubstituted cycloalkyl group, a carboxyl group, or a carboxylic acid ester group; A represents an oxygen atom, or a sulfur atom; R represents a hydrogen atom, an unsubstituted alkyl group, or a substituted or unsubstituted aralkyl group; n represents 0 or 1; and Z is a divalent linking group and represents as an alkylidene group, an aralkylidene group, or a sulfur atom.

In another embodiment of the photosensitive composition, the present invention provides a photosensitive composition, comprising a photosensitive and heat-developable element and a polymerizable polymer precursor, wherein the photosensitive and heat-developable element contains a compound represented by the following Formula (IV)

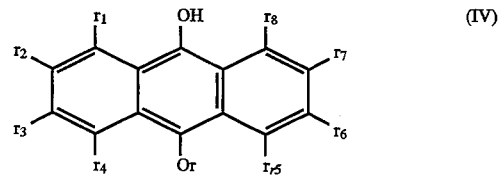

wherein r represents a hydrogen atom, a substituted or unsubstituted alkyl group, an alkenyl group, an alkynyl group, an aryl group, an aralkyl group, an alkoxyalkyl group, or an acyl group; $r_1$, $r_2$, $r_3$, $r_4$, $r_5$, $r_6$, $r_7$ and $r_8$ each independently represent a hydrogen atom, a halogen atom, a substituted or unsubstituted alkyl group, an alkoxyl group, a hydroxyl group, a substituted or unsubstituted amino group, an amido group, an aryl group, an alkenyl group, an alkynyl group, a carboxyl group, a sulfonyl group, or a sulfoxyl group, which may be the same or different from each other, and in which $r_1$ to $r_8$, or r, may serve as a divalent linking group to give dimer or $r_1$ and $r_2$, $r_2$ and $r_3$, $r_3$ and $r_4$, $r_5$ and $r_6$, $r_6$ and $r_7$, and $r_7$ and $r_8$ may be combined to form condensed ring.

The present invention also provides photosensitive material, comprising a photosensitive and heat-developable element and a photopolymerizable element which are contained in the same layer, an imagewise unexposed area on the material being polymerized by imagewise exposure, heating, and whole areal exposure.

The present invention further provides an image forming method, comprising the steps subjecting a photosensitive material containing a photosensitive and heat-developable element and a photopolymerizable element in the same layer to imagewise exposure and heating to form an image; and subjecting the resultant photosensitive material to whole areal exposure to polymerize an imagewise unexposed area thereof.

In another embodiment of the image forming method, the present invention also provides an image forming method, comprising the steps of;

subjecting a photosensitive material containing a photosensitive and heat-developable element and a polymerizable polymer precursor, to imagewise exposure and heating to form an image; and subjecting the resultant photosensitive material to whole areal exposure to polymerize an imagewise exposed area thereof.

In still another embodiment of the image forming method, the present invention further provides an image forming method, comprising the steps subjecting a photosensitive material containing a photosensitive and heat-developable element and a photopolymerizable element, or a photosensitive and heat-developable element and a polymerizable polymer precursor, to imagewise exposure and first heating; and thereafter subjecting the resultant photosensitive material to whole areal exposure and second heating to form a polymer image.

Other preferred embodiments of the present invention will become apparent from the description set out below.

BRIEF DESCRIPTION OF THE DRAWINGS

FIG. 1A to FIG. 4 are partial cross sections to diagramatically illustrate respective steps in the method of the present invention, in which;

FIGS. 1A to 1C and FIGS. 2A to 2C are partial cross sections to diagramatically illustrate the reaction that takes place in the photosensitive material in the course of forming a polymer image in the method of the present invention; and FIG. 3 and FIG. 4 are partial cross sections to diagramatically illustrate the processing to make a polymer latent image visible and forming it into a color image, in the method of the present invention

DETAILED DESCRIPTION OF THE PREFERRED EMBODIMENTS

Figure 1A:
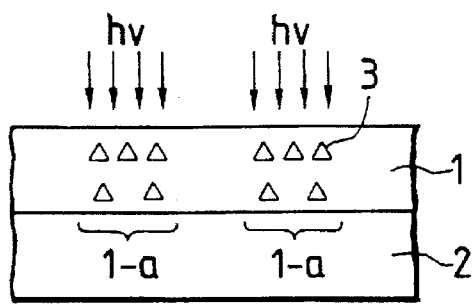

For achieving the above objects, the present inventors made intensive studies, and as a result they reached a finding of a novel photosensitive composition, a novel photosensitive material, and a novel image forming method, particularly in image forming methods in which, utilizing the properties of metallic silver nuclei obtained by exposing photosensitive silver halide to light, an oxidation-reduction image is formed at the time of heat development of said silver salt; and a polymerizable polymer precursor is polymerized by light, corresponding to a pattern of the oxidation-reduction image, to form a polymer image.

In an embodiment of the photosensitive material of the present invention, the photosensitive material comprises a photosensitive and heat-developable element and a photopolymerizable element which are contained in the same layer, an imagewise unexposed area on the material being polymerized by imagewise exposure, heating, and whole areal exposure. Here, the photosensitive and heat-developable element refers to an element which comprises at least a photosensitive silver halide, an organic silver salt and a reducing agent, and which is capable of forming an oxidation-reduction image when subjected to imagewise exposure using the light having a photosensitive wavelength region for the photosensitive silver halide, and further subjected to heating. The photopolymerizable element refers to an element which comprises at least a polymerizable polymer precursor and a photopolymerization initiator, and which is capable of being polymerized by irradiation of light to which the photopolymerization initiator has a sensitivity. Containing the above two elements in the same layer of the photosensitive material, is compared to the conventional case of forming a polymer image constituted of multilayers, results in no lowering of image quality occuring upon the conversion of an unexposed image into a polymer image, thus achieving a high resolution. Processing steps can be lessened also when the polymer image is taken out. In addition, because of less coating steps, the production cost can be reduced, advantageously.

The photosensitive material of the present invention is subjected to imagewise exposure under an energy of up to 1 mJ/cm$^2$ at maximum, through a mask having an optical density of 3.0 or more at the masked portion, using light having a wavelength to which the silver halide has a sensitivity, as exemplified by light of 400 nm or less in the case where the silver halide comprises silver chloride and has not been sensitized, light of 450 nm or less in the case where the silver halide comprises silver bromide and has not been sensitized, light of 480 nm or less in the case where the silver halide comprises silver iodide and has not been sensitized, and light within a sensitizing region in the case where the silver halide has been sensitized, e.g., light of about 1,000 nm or less when it has been infrared-sensitized; and then subjected to heating at temperatures of from 60° C. to 200° C., and preferably from 100° C. to 150° C., for from 1 second to 5 minutes, and preferably from 3 seconds to 60 seconds, with use of a hot plate, a heat roller or the like. At this stage, an optical image may be formed or may not be formed on the imagewise exposed area. Thereafter, the whole areal exposure is applied under an energy of up to 50 J/cm2 at maximum, using the light having a wavelength to which the photopolymerization initiator has a sensitivity, e.g., light of from 250 nm to 700 nm, and more preferably from 300 nm to 500 nm, whereupon the imagewise unexposed area is polymerized. The material of the present invention is characterized by the above.

The wording "the imagewise unexposed area is polymerized" means that the polyerizable polymer precursors in the imagewise unexposed portion are bound or linked to each other through the above processings (imagewise exposure, heating and whole areal exposure), thereby being polymerized. The polymerization of the imagewise unexposed area also means a state capable of being converted a visible image such as an uneven pattern, a turbidity pattern and a colored pattern by utilizing chemical and/or physical changes in, for example, solubility to a solvent, stickiness and refractivity, where these changes results from the polymerization. Such a state can be distinguished visually or through a spectrometric measurement.

To describe in detail a first embodiment of the photosensitive composition (hereinafter "photosensitive composition (1)'") constituting the above photosensitive material of the present invention, the photosensitive composition comprises a photosensitive and heat-developable element and a photopolymerizable element, wherein the photosensitive and heat-developable element contains at least one compound selected from the group of compounds represented by the following Formula (I), (II) or (III):

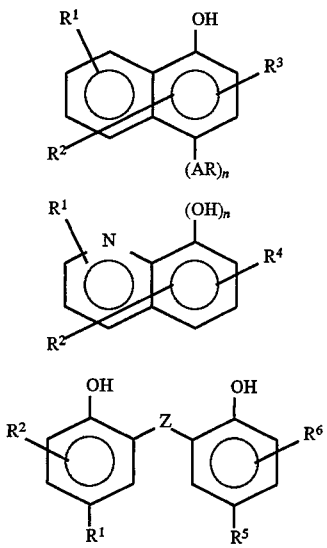

wherein $R^1$, $R^2$, $R^3$, $R^5$ and $R^6$ each represent a hydrogen atom, a halogen atom, a hydroxyl group, a substituted or unsubstituted alkyl group, a substituted or unsubstituted aralkyl group, a substituted or unsubstituted aryl group, an alkoxy group, or a substituted or unsubstituted cycloalkyl group; $R^4$ represents a hydrogen atom, a halogen atom, a substituted or unsubstituted alkyl group, a substituted or unsubstituted aralkyl group, a substituted or unsubstituted aryl group, a substituted or unsubstituted cycloalkyl group, a carboxyl group, or a carboxylic acid ester group; A represents an oxygen atom, or a sulfur atom; R represents a hydrogen atom, an unsubstituted alkyl group, or a substituted or unsubstituted aralkyl group; n represents 0 or 1 (when n is 0, it means that the group AR does not exist); and Z is a divalent linking group and represents an alkylidene group, an aralkylidene group, or a sulfur atom.

More specifically, the photosensitive composition (1) contains at least a photosensitive silver halide, an organic silver salt, a reducing agent, a polymerizable polymer precursor and a photopolymerization initiator, and contains as the above reducing agent at least one compound represented by the above Formula (I), (II) or (III).

In regard to the-substituents $R^1$ to $R^6$ in the above Formula (I), (II) or (III), the halogen atom includes a fluorine atom, a chlorine atom, a bromine atom, and an iodine atom.

The substituted or unsubstituted alkyl group includes a straight-chain or branched alkyl group having 1 to 18 carbon atoms, as exemplified preferably by methyl, ethyl, propyl, i-propyl, buryl, t-buryl, i-buryl, amyl, i-amyl, hexyl, heptyl, octyl, nonyl, dodecyl, stearyl, methoxyethyl, ethoxyethyl, ethoxypropyl, ethoxybutyl, propoxybutyl, i-propoxypentyl, t-butoxyethyl, hexyloxybutyl, hydroxymethyl, hydroxyethyl, hydroxypropyl, hydroxybutyl, hydroxypentyl, hydroxyhexyl, hydroxyheptyl, aminomethyl, dimethylaminomethyl, aminoethyl, dimethylaminoethyl, diethylaminoethyl, morpholinoethyl, piperidinoethyl, aminopropyl, diethylaminopropyl, dipropylaminoethyl, aminobutyl, and morpholinobutyl.

The substituted or unsubstituted aralkyl group includes those having 7 to 19 carbon atoms, as exemplified preferably by benzyl, phenetyl, benzhydryl, trityl, phenylpropyl, naphthylmethyl, chlorobenzyl, dichlorobenzyl, methoxybenzyl, and methylbenzyl.

The substituted or unsubstituted aryl group include those having 6 to 16 carbon atoms, as exemplified preferably by phenyl, naphthyl, anthryl, phenanthryl, tolyl, xylyl, cumenyl, mesityl, chlorophenyl, methoxyphenyl, and fluorophenyl.

The alkoxyl group includes those having 1 to 18 carbon atoms, as exemplified preferably by methoxy, ethoxy, propoxy, i-propoxy, and butoxy.

The substituted or unsubstituted cycloalkyl group includes those having 5 to 18 carbon atoms, as exemplified preferably by cyclopentyl, cyclohexyl, cycloheptyl, cyclooctyl, methylcyclohexyl, dimethylcyclohexyl, and ethylcyclohexyl.

The carboxylic acid ester includes those having 2 to 10 carbon atoms, as exemplified preferably by methoxycarbonyl, ethoxycarbonyl, and propoxycarbonyl.

The alkylene group includes those having 1 to 8 carbon atoms, as exemplified preferably by methylene, ethylidene, butylidene, and hexylidene.

The aralkylene group includes those having 7 to 18 carbon atoms, as exemplified preferably by phenylmethylene, naphthylmethylene, p-dimethylaminophenylmethylene, p-hydroxyphenylmethylene, and ptolylmethylene.

Of the reducing agent represented by the above Formula (I), (II) or (III), specific examples of particularly preferred cbmpounds are set out below, but the reducing agent (I), (II) or (III) mentioned in the present invention is by no means limited to these.

Specific examples of the compound represented by Formula (I) includes, for example, 1,4-dihydroxynaphthalene, 4-methoxy-1-naphthol, 4-ethoxy-1-naphthol, 5-methyl-4-methoxy-1-naphthol, 1,5-dihydroxynaphthalene, 4-chloro-1-naphthol, 5-chloro-1-naphtrol, 4-methylthio-1-naphthol, 4-ethylthio-1-naphthol, 6-phenyl-4-methyl-1-naphthol, 6-phenyl-4-methoxy-1-naphthol, 6-benzyl-1-naphthol, 6-benzyl-4-methoxy-1-naphthol, 4-methyl-1,7-dihydroxynaphthalene, 4-methoxy-6-benzyl-1-naphthol, 4-methoxy-6-cyclohexyl-1-naphthol, 4-methylthio-6-cyclohexyl-1-naphthol, 3,4-dimethyl-1-naphthol, and 4-benzyloxy-1-naphthol.

Specific examples of the compound represented by Formula (II) includes, for example, hydroxyquinoline, 4,8-dihydroxyquinoline-2-carboxylic acid, 4-hydroxyquinoline-2-carboxylic acid, 4-methyl-8-hydroxyquinoline, 4-benzyl-8-hydroxyquinoline, and 4,8-dihydroxy-5-methylquinoline.

Specific examples of the compound represented by Formula (III) includes, for example, 2,2'-methylenebis(6-t-butyl-1,4-dihydroxybenzene), 2,2'-methylenebis(4-methoxyphenol), 2,2'-methylenebis(4,6-di-t-butylphenol), 2,2'-methylenebis(4-methyl-6-t-butylphenol), 2,2'-butytidenebis-4-methoxyphenol), 2,2'-butylidenebis(6-t-butyl-1,4-dihydroxybenzene), 2,2'-thiobis(4-methoxyphenol), 2,2'-thiobis(6-methyl-1,4-dihydroxybenzene), 2,2'-thiobis(4,6-di-t-butylphenol), bis (2-hydroxy-5-methylphenyl) phenylmethane, and (3-t-butyl-5-methyl-2-hydroxyphenyl)-(5-methoxy-2-hydroxyphenyl)methane.

Of the above reducing agents, two or more kinds may be used in combination, and it is also possible to use these compounds in combination with any conventionally known reducing agents so long as the object of the present invention may not be hindered.

Silver halide used in the formation of photosensitive composition (1) of the present invention may include silver chloride, silver bromide, silver chlorobromide, silver iodobromide and silver chloroiodobromide, and these may have been subjected to chemical sensitization and optical sensitization as conventionally applied with respect to usual photographic emulsions. More specifically, as the chemical sensitization, sulfur sensitization, noble metal sensitization, reduction sensitization and so forth can be used, and, as the optical sensitization, the methods that employ hitherto well known sensitizing dyes can be applied.

The organic silver salt that can be used includes silver salts of organic acid, silver salts of triazole and so forth, which are organic silver salts as described in "SHASHIN KOGAKU NO KISO (Basis of Photographic Engineering), The Volume of Non-silver-salt, p.247" or Japanese Unexamined Patent Publication No. 59-55429, and it is preferred to use silver salts having a low sensitivity.

As the polymerizable polymer precursor used in photosensitive composition (1), a compound having at least one of reactive vinyl group in its molecule can be utilized, and there can be used, for example, at least one selected from the group consisting of reactive vinyl group-containing monomers, reactive vinyl group-containing oligomers and reactive vinyl group-containing polymers.

The reactive vinyl group in these compounds includes substituted or unsubstituted vinyl groups having polymerization reactivity as exemplified by styrene type vinyl groups, acrylic acid type vinyl groups, methacrylic acid type vinyl groups, allyl type vinyl groups, and vinyl ether, as well as ester type vinyl groups such as vinyl acetate.

Specific examples of the polymerizable polymer precursor satisfying such conditions are as follows.

They may include monovalent monomers as exemplified by styrene, methylstyrene, chlorostyrene, bromostyrene, methoxystyrene, dimethylaminostyrene, cyanostyrene, aminostyrene, acrylic acid, methyl acrylate, ethyl acrylate, cyclohexyl acrylate, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, N-methyl-2-vinylimidazole, propyl vinyl ether.,butyl vinyl ether, isobutyl vinyl ether, β-chloroethyl vinyl ether, phenyl vinyl ether, p-methylphenyl vinyl ether and p-chlorophenyl vinyl ether; divalent monomers as exemplified by divinylbenzene, di(ethyl acrylate) oxalate, di(methyl ethyl acrylate)oxalate, di(ethyl acrylate) malonate, di(methyl ethyl acrylate) malonate, di(ethyl acrylate) succinate, di(ethyl acrylate) glutsrate, di(ethyl acrylete) adipate, di(ethyl acrylate) maleate, di(ethyl acrylate) fumarate, di(ethyl acrylate) β,β-dimethylglutarate, 1,4-phenylenebis(oxyethyl acrylate), 1,4-phenylenebis(oxymethylethyl acrylate), 1,4bis(acryloyloxyethoxy)cyclohexane, bis(acryloyloxymethylethoxy)cyclohexane, di(ethyl methacrylate) oxalate, di(methyl ethyl methacrylate) oxalate, di(ethyl methacrylate) malonate, di(methyl ethyl methacrylate) malonate, di(methyl ethyl methacrylate) succinate, di(methyl ethyl methacrylate) succinate, di(ethyl methacrylate) glutarate, di(ethyl methacrylate) adipate, di(ethyl methacrylate) maleate, di(ethyl methacrylate) fumalate, di(methyl ethyl methacrylate fumalate, di(ethyl methacrylate)β, β'-dimethylglutarate, 1,4-phenylenebis (oxyethyl methacrylate), 1,4-bis(methacryloyloxyethoxy) cyclohexane, acryloyloxyethoxyethyl vinyl ether; trivalent monomers exemplified by pentaerythritol triacrylate, pentaerythritol trimethacrylate, pentaerythritol tri (hydroxylstylene), 1,1,1-trimethylolprobane triacrylate, 1,1,1-trimethylolpropane trimethacrylate, 1,1,1-trimethylolpropane tri(ethyl acrylate).

These polymerizable polymer precursors may be used in combination of two or more kinds, as mentioned above.

The photopolymerization initiator used in photosensitive composition (1) may include carbonyl compounds, sulfur compounds, halogen compounds, and photopolymerization initiators of redox type.

Specifically, the carbonyl compounds include diketones as exemplified by benzyl, 4,4'-dimethoxybenzyl, diacetyl, and camphorquinone; benzophenones as exemplified by 4,4'-bis(diethylamino)benzophenone, and 4,4'-dimethyoxylbenzophenone; acetophenones as exemplified by acetophenone, 4'-methoxyacetophenone; benzoin alkyl ethers; thioxanthones as exemplified by 2-chlorothioxanthone, 2,5-diethylthioxanthone, and thioxanthone-3-carboxylic acid-β-methoxy ethyl ester; chalcones and styrylketones having a dialkylamino group; and coumarins as exemplified by carbonylbis(7-methoxycoumarin), and 3,3'-carbonylbis(7-diethylaminocoumarin).

The sulfur compounds include disulfides as exemplified by dibenzothiazolyl sulfide, and decylphenyl sulfide.

The halogen compounds include, for example, carbon tetrabromide, quinolinesulfonyl chloride, and S-triazines having a trihalomethyl group.

The photopolymerization initiators of redox type include those used in combination of a trivalent iron ionic compound (as exemplified by ferric ammonium citrate) with a peroxide, and those used in combination of a photoreducing dye such as riboflavin or Methylene Blue with a reducing agent such as triethanolamine or ascorbic acid.

In the photopolymerization initiator described above, two or more compounds can also be used in combination to obtain a more efficient photopolymerization reaction.

Such combination of the photopolymerization initiators includes a combination of chalcones, styrylketones or cumarins having a dialkylamino group with S-triazines having a trihalomethyl group or camphorquinone.

The above photosensitive silver halide, organic silver salt, at least one of reducing agents (I), (II) and (III), polymerizable polymer precursor and photopolymerization initiator should be contained in photosensitive composition (1) as essential components.

The above components in photosensitive composition (1) may preferably be mixed in the proportion as follows:

Silver halide may desirably be contained in an amount of preferably from 0.001 mol to 2 mols, and more preferably from 0.05 to 0.4 mol, per mol of the organic silver salt. The reducing agent may desirably be contained in an amount of preferably from 0.2 mol to 3 mols, and more preferably from 0.4 mol to mol, per mol of the organic silver salt. The photopolymerization initiator may desirably be contained in an amount of preferably from 0.1 part by weight to 50 parts by weight, and more preferably from 0.5 part by weight to 50 parts by weight, per 100 parts by weight of the polymerizable polymer precursor. The photopolymerization initiator may desirably be contained in an amount of preferably from 0.01 mol to 10 mols, and more preferably from 0.1 mol to 3 mols, per mol of the reducing agent.

In a second embodiment of the photosensitive composition of the present invention (hereinafter "photosensitive composition (2)"), the photosensitive composition comprises a photosensitive and heat-developable element and a polymerizable polymer precursor, wherein the photosensitive and heat-developable element contains a compound represented by the following Formula (IV)

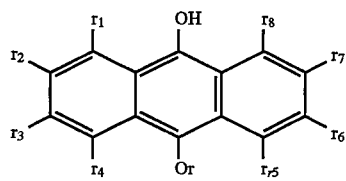

wherein r represents a hydrogen atom, a substituted or unsubstituted alkyl group, an alkenyl group, an alkynyl group, an aryl group, an aralkyl group, an alkoxyalkyl group, or an acyl group; $r_1$, $r_2$, $r_3$, $r_4$, $r_5$, $r_6$, $r_7$ and $r_8$ each independently represent a hydrogen atom, a halogen atom, a substituted or unsubstituted alkyl group, an alkoxyl group, a hydroxyl group, a substituted or unsubstituted amino group, an amido group, an aryl group, an alkenyl group, an alkynyl group, a carboxyl group, a sulfonyl group, or a sulfoxyl group, which may be the same or different from each other, and in which $r_1$ to $r_8$, or r, may serve as a divalent linking group to give a dimer or $r_1$ and $r_2$, $r_2$ and $r_3$, $r_3$ and $r_4$, $r_5$ and $r_6$, $r_6$ and $r_7$, and $r_7$ and $r_8$ may be combined to form a condensed ring.

More specifically, the photosensitive composition (2) contains at least a photosensitive silver halide, an organic silver salt, a reducing agent and a polymerizable polymer precursor, and contains as the above reducing agent the compound represented by the above Formula (IV).

The compound represented by the above Formula (IV) can be obtained by reduction reaction of a quinone, or chemical modification of hydroanthraquinone. These synthesis methods are described in Annalen der Chemie, Vol. 379, page 67, Journal of Chemical Society, Vol. 123, p.2029, Journal of American Chemical Society, Vol. 70, p.3738, Berichite der Chemie, Vol. 63, p.1690, and Berichite der Chemie, Vol. 63, p.1301, etc.

Of the reducing agent represented by the above Formula (IV), specific examples of particularly preferred compounds are set out below, but the reducing agent (IV) mentioned in the present invention is by no means limited to these: Anthrahydroquinone, 1-methylanthrahydroquinone, 2-methylanthrahydroquinone, 1-ethylanthrahydroquinone, 2-ethylanthrahydroquinone, 1-acetylaminoanthrahydroquinone, 2-acetylaminoanthrahydroquinone, anthrahydroquinone mondmethyl ether, anthrahydroquinone monoethyl ether, 1-methylanthrahydroquinone monomethyl ether, 2-methylanthrahydroquinone monoethyl ether, 2-ethylanthrahydroquinone monoethyl ether, 1-dimethylaminoanthrahydroquinone, 1-dimethylaminoanthrahydroquinone monomethyl ether, 2-aminoanthrahydroquinone, 2-diethylaminoanthrahydroquinone monoethyl ether, 2-propionic acid amide anthrahydroquinone, 1-chloroanthrahydroquinone, 1-chloroanthrahydroquinone monopropyl ether, 2-chloroanthrahydroquinone, 2-chloroanthrahydroquinone monomethyl ether, 1,5-dichloroanthrahydroquinone monoethyl ether, and bis (anthrahydroxy-2-)glyoxylic acid.

Of the above reducing agents, two or more kinds may be used in combination, and it is also possible to use these compounds in combination with any conventionally known reducing agents and/or photopolymerization initiators so long as the object of the present invention may not be hindered.

In the photosensitive composition (2) of the present invention, the same components as in the case of photosensitive composition (1) of the present invention, previously described, can be used in regard to the components other than the above reducing agent, i.e., the photosensitive silver halide, organic silver salt, and polymerizable polymer precursor.

The above photosensitive silver halide, organic silver salt, polymerizable polymer precursor, and reducing agents (IV) must be contained in photosensitive composition (2) as essential components.

The above components in photosensitive composition (2) are usually mixed in the proportion as follows:

Silver halide may preferably be contained in an amount of from 0.001 mol to 2 mols, and more preferably from 0.05 to 0.5 mol, per mol of the organic silver salt.

The reducing agent (IV) may preferably be contained in an amount of from 0.2 mol to 3 mols, and more preferably from 0.4 mol to 1.3 mols, per mol of (photosensitive silver halide+organic silver salt). The reducing agent (IV) may also preferably be contained in an amount of from 0.01 part by weight to 50 parts by weight, and more preferably from 0.1 part by weight to 30 parts by weight, per 100 parts by weight of the polymerizable polymer precursor.

The above photosensitive compositions (1) and (2) each may be dissolved in a solvent together with a suitable binder and applied to a support (the numeral 2 in FIG. 1A to FIG. 4) made of metal, plastic or paper followed by drying, so that corresponding photosensitive materials (1) and (2) can be obtained. Photosensitive materials (1) and (2) may be constituted of a single layer or of multi-layers. If strength can be maintained by the binder itself, the photosensitive materials can be formed, without the support 2, by incorporating the above essential components into a film or a sheet-like member formed with the binder.

The photosensitive composition may also be applied, in a dispersed or encapsulated state to the support.

When the capsules, in which two or more kinds of photosensitive compositions comprising different colorants having sensitivities to light of different wavelengths in spectral sensitization to give different color tones are respectively enclosed with wall materials having functions of filtering other light, are applied to the same support, it is possible to obtain a medium capable of forming a color image in one shot.

The photosensitive material may be of any forms including flat sheets, cylinders, rolls and so forth, without any particular limitations, which may depend on the support.

Suitable binders used in the present invention can be selected from a wide range of resins.

They specifically include cellulose esters as exemplified by nitrocellulose, cellulose phosphate, cellulose sulfate, cellulose acetate, cellulose propionate, cellulose butyrate, cellulose myrystate, cellulose palmirate, cellulose acetate propionate, and cellulose acetate butyrate; cellulose esters as exemplified by methyl cellulose, ethyl cellulose, propyl cellulose, and butyl cellulose; vinyl resins as exemplified by polystyrene, polyvinyl chloride, polyvinyl acetate, polyvinyl butyral, polyvinyl acetal, polyvinyl alcohol, and polyyinyl pyrrolidone; copolymer resins as exemplified by a styrene/butadiene copolymer, a styrene/acrylonitrile copolymer, a styrene/butadiene/acrylonitrile copolymer, and a vinyl chloride/vinyl acetate copolymer; acrylic resins as exemplified by polymethyl methacrylate, polydimethylaminoethyl methacrylate, polymethyl acrylate, polybutyl acrylate, polyacrylic acid, polymethacrylic acid, polyacrylamide, and polyacrylonitrile, or copolymers of any of these; polyesters as exemplified by polyethylene terephthalate; polyarylate resins as exemplified by poly(4,4'-isopropylidene, diphenylene-co-1,4-cyclohexylenedimethylene carbonate), poly(ethylenedioxy-3,3'-phenylene thiocarbonate), poly(4,4'-isopropylidene, diphenylene carbonate-co-terephthalate), poly(4,4'-isopropylidene, diphenylene carbonate), poly(4,4'-sec-butylidene, diphenylene carbonate), and poly(4,4'-isopropylidene, diphenylene carbonate-block-oxyethylene); polyamides; polyimides; epoxy resins; phenol resins; polyolefins as exemplified by polyethylene, polypropylene, and chlorinated polyethylene; and natural polymers such as gelatin.

In the photosensitive compositions (1) and (2) of the present invention, the binder is not an essential component. This may not be contained if the film properties, sensitivities or the like of the photosensitive material can be sufficiently secured.

Besides this, it is also possible to optionally add to the photosensitive composition a coloring material, an antifoggant, a photo-discoloration preventive agent, a solid solvent, a surface active agent, an antistatic agent, etc.

The photosensitive material may have a film thickness of from 0.1 μm to 2 mm, and preferably from 1 μm to 0.1 mm, in approximation.

The image forming method that employs the above photosensitive materials (1) and (2) includes an image forming method having at least the steps of imagewise exposure, heating, and whole areal exposure with respect to the photosensitive material to form a polymer image, and further an image forming method in which the polymer image obtained through the above steps is utilized to form a color image.

In the first place, the image forming method that employs the above photosensitive material (1) (hereinafter "image forming method (1)") is an image forming method, comprising the steps of;

subjecting a photosensitive material containing a photosensitive and heat-developable element and a photopolymerizable element in the same layer to imagewise exposure and heating to form an image; and subjecting the resultant photosensitive material to whole areal exposure to polymerize an imagewise unexposed area thereof.

More specifically, it is an image forming method comprising the steps of;

(a) subjecting the photosensitive material (1) to imagewise exposure to form a latent image;

(b) heating the photosensitive material (1) on which the latent image has been formed to convert the latent image into a second latent image comprised of the above-described reducing agent and the oxidized product produced from the reducing agent; and (c) subjecting the photosensitive material (1), having the second latent image comprised of the reducing agent and the oxidized product, to whole areal exposure to polymerize the above-described polymerizable polymer precursor, corresponding to the distribution of the reducing agent and oxidized product, thereby forming a-polymer image.

Figure 1B:
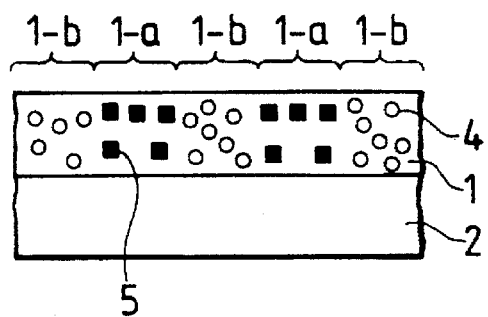
Figure 1C:
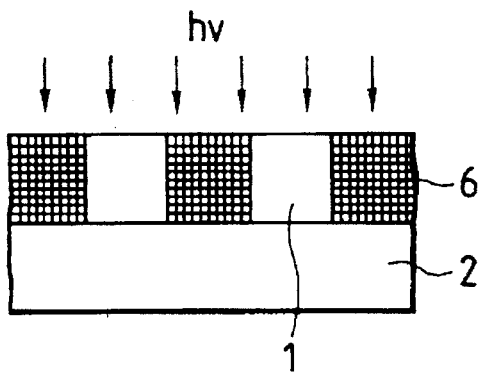

The outline of the reaction in each step included in the image forming method (1) will be further described below with reference to the drawings (FIGS. 1A to 1C).

Step (a) in the image forming method (1) of the present invention is the step of carrying out the writing of an image by light, where, as illustrated in FIG. 1A, a photosensitive layer 1 on a support 2 is exposed to light for a desired image according to analog exposure using a mask or the like, or digital exposure using a laser or the like according to external electric signals or photosignals.

As a result, silver nuclei 3 are formed on the photosensitive silver halide in an exposed area 1-a, thus forming the latent image. The silver nuclei 3 thus formed act as a catalyst for the thermal reaction between the organic silver salt and reducing agent contained in the photosensitive layer 1.

The exposure at the stage of the writing of the latent image may be carried out by appropriately selecting conditions, for example, the concentration, type, etc. of the silver halide contained in the photosensitive layer, under which any desired performances such as a sufficient contrast can be obtained in the resulting polymer image.

Since in this step the photosensitive silver halide is used, it becomes possible to effect the writing with a high speed.

Next, in step (b) (FIG. 1B) of image forming method (1) of the present invention, the photosensitive material (1) on which the latent image has been formed is heated, so that the silver nuclei 3 selectively act as a catalyst in the exposed area 1-a to cause the reaction between the organic silver salt and reducing agent, where the organic silver salt is reduced to a silver metal and at the same time the reducing agent is oxidized to form an oxidized product 5.

As a result, there are formed the exposed area 1-a containing the oxidized product 5 and an unexposed area 1-b containing the reducing agent 4. Since, as described below, the reducing agent 4 used in the photosensitive material is oxidized to turn into an oxidized product having a polymerization inhibitory power against the polymerizable polymer precursor, there is formed is a photosensitive layer a latent image which is ascribable to the difference in the polymerization inhibitory power, constituted by the distribution of the oxidized products 5.

The heating in this step (b) is carried out by appropriately selecting conditions necessary for the oxidation-reduction reaction to proceed. Not sweepingly describable since the conditions depend on the composition, etc. of the photosensitive composition, the heating may preferably be carried out at 60° C. to 200° C., and more preferably 100° C. to 150° C., for 1 second to 5 minutes, and more preferably 3 seconds to 60 seconds. In general, the heating at high temperatures causes a heating in a short timer and the heating at low temperatures requires a heating for a long time. A heating means includes a method in which a hot plate, heat roll, thermal head or the like is used, as well as a method in which a heating element of the support is electrified to carry out a heating, or a method in which a heating is carried out by irradiation of laser beams. Usually the heating is made under substantially uniform heating.

Subsequently, step (c) (FIG. 1C) in image forming method (1) of the present invention follows, but, before starting step (c), a transferring medium or the like may be laminated on the surface to be exposed to light, for the purpose of preventing the polymerization reaction from being inhibited by oxygen.

In step (c), the photosensitive layer 1 is subjected to whole areal exposure to permit the photopolymerization initiator contained in the layer to cleane, generating radical species. The radical species cause the polymerization reaction to form a polymerized area 6 in the photosensitive layer 1. Namely, since the concentration of the oxidized product having the polymerization inhibitory power differs between the exposed area 1-a and unexposed area 1-b, a difference in a polymerization state is produced between the exposed area 1-a and unexposed area 1-b, and this difference results in the formation of the polymer image.

In the present invention, the oxidized product has the polymerization inhibitory power and the unexposed area turns to the polymerized area, so that the polymer image, which is positive, can be formed.

As light sources used in the above steps (a) and (c), usable are, for example, sunlight, tungsten lamps, mercury lamps, halogen lamps, xenon lamps, fluorescent lamps, LEDs, and lasers, and the wavelength of the light used in these steps may be the same or different. Even if the light having the same wavelength is used, the latent image can be sufficiently written with use of light having an intensity of the level that may not cause photopolymerization in the above step (a), since the silver halide usually has a sufficiently higher photosensitivity than the photopolymerization initiator.

In the above step (c) the photosensitive material may be additionally heated for the purpose of further accelerating photopolymerization, or the thermal inertia in the above step (b) may be utilized.

According to the above-described image forming method (1) of the present invention, firstly the polymer image formation can be completed in a short time because of its system of whole areal exposure, and the processing time starting from the writing for the image formation and ending with the development in the respective steps can be shortened in a good efficiency, and also the polymerization inhibitor produced in part even in a small amount in the composition originally containing no polymerization inhibitor makes it possible to perfectly inhibit the photopolymerization at the corresponding part, and therefore it is possible to obtain a polymer image with a more sufficient contrast.

In the second place, the image forming method that employs the above photosensitive material (2) (hereinafter "image forming method (2)") is an image forming method, comprising the steps of;

subjecting a photosensitive material containing a photosensitive and heat-developable element and a polymerizable polymer precursor, to imagewise exposure and heating; and subjecting the resultant photosensitive material to whole areal exposure to polymerize an imagewise exposed area thereof.

More specifically, it is an image forming method comprising the steps of;

(a) subjecting the photosensitive material (2) to imagewise exposure to form a latent image comprised of silver nuclei;

(b) heating the photosensitive material (2) to newly generate on the area of said latent image a silver metal and a substance having the power to initiate photopolymerization; and (c) subjecting the photosensitive material (2) to whole areal exposure to to form a polymer image on the exposed area.

Figure 2A:
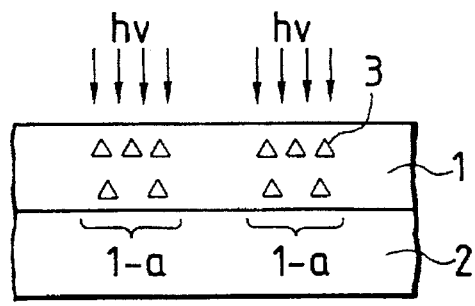
Figure 2B:
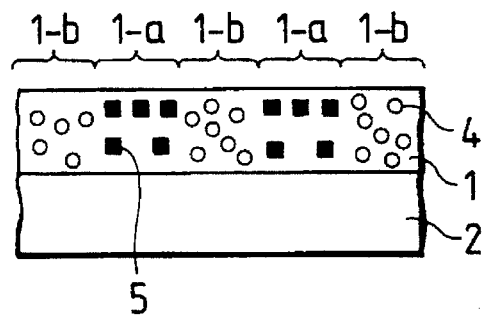
Figure 2C:
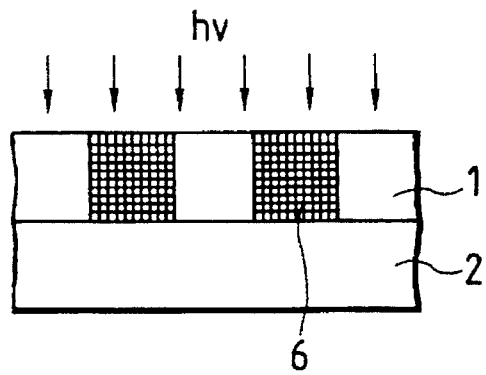

The outline of the reaction in each step included in the image forming method (2) will be described below with reference to the drawings (FIGS. 2A to 2C).

Method (2) of the present invention is a method in which there is used a photosensitive material comprising the reducing agent (IV) in place of the reducing agent and photopolymerization initiator which are the components contained in the photosensitive composition used in the method (1) of the present invention.

Step (a) in the method (2) of the present invention is like the step (a) in the method (1) of the present invention previously described, the step of carrying out the writing of an image by light. In this step (FIG. 2A), silver nuclei 3 are formed in the similar manner to in the method (1).

Next, in step (b) (FIG. 2B) of the method (2) of the present invention, the photosensitive material is heated, so that the organic silver salt reacts with the reducing agent (IV). As a result the organic silver salt is reduced to a silver metal and at the same time the reducing agent (IV) is oxidized to turn into the substance having the power to initiate photopolymerization (i.e., an oxidized product 5).

Although the chemical structure of the substance having the power to initiate photopolymerization depends on its precursor, the substance is presumed to mainly comprise a quinone compound, as exemplified below. It, however, may comprise a structure other than it. The substance having the power to initiate photopolymerization may be used above, or may form a complex with the silver salt, reduced product of the silver salt, reducing agent (IV) or the like contained in the photosensitive layer 1 to actually exhibit the power to initiate photopolymerization.

The heating conditions and heating means in this step (b) may be the same as in the step (b) of method (1).

Subsequently, step (c) (FIG. 2C) in image forming method (2) of the present invention follows, but, before starting step (c), a transferring medium may be laminated on the surface to be exposed to light, for the purpose of preventing the polymerization reaction from being inhibited by oxygen.

In step (c), the photosensitive layer 1 is subjected to whole areal exposure to permit the substance having the power to initiate photopolymerization contained in said layer to be excited, to generate radical species. The radical species cause the polymerization reaction to form a polymer image in the photosensitive layer 1. Namely, the polymer precursor at an exposed area 1-a is photopolymerized. The light source used here may be the same as used in the method (1).

The present invention is different from the method disclosed in U.S. Pat. No. 4,649,098, and is a method in which the latent image comprising the photopolymerization initiator is formed through the step (a) of imagewise exposure and the step (b) of heating, where the imagewise unexposed area is not polymerized even when the amount of exposure is excessive in the whole areal exposure in step (c), and thus the polymer image can be surely taken out.

Also, the amount of the photopolymerization initiator to be produced can be controlled according to the intensity of imagewise exposure, and hence the gradation in polymerization degree can be taken with ease, as compared with the case that the amount of polymerization inhibitor is decreased.

Also in the method (2) of the present invention, in the same manner as the method (1) of the present invention, the photosensitive material may be additionally heated in the above step (c) for the purpose of more accelerating photopolymerization, or the thermal inertia in the above step (b) may be utilized.

In the methods (1) and (2) of the present invention, heating the photosensitive material upon making whole areal exposure is meaningful for accelerating the rate of curing, and can make the photosensitive layer 1 free from nonuniformity in a polymerization degree or/and a cross-linking degree caused by ununiform temperature changes.

More specifically, in the case where the imagewise exposure, heating, and whole areal exposure are continuously carried out in one apparatus, the polymerization sensitivity at the time of the whole areal exposure may vary depending on temperature changes (of surroundings and/or the photosensitive material) to give a difference in a resolution or plate wear resistance (abrasion resistance) upon carrying out inking. For this reason, carrying out the whole areal exposure while heating results in obtaining more stably and efficiently a final polymer image.

In the heating, the temperature fluctuation may be intentionally applied so that the nonuniformity in the amount of light in the whole areal exposure may be compensated.

The heating at this stage may preferably carried out at a temperature such that it is lower than the temperature applied in step (b) to the photosensitive material and that a temperature difference therebetween is 10° C. or more, preferably 20° C. or more. Though depending on the type of the reducing agent, the heating may be generally carried out at a temperature in the range of from 40° C. to 150° C., preferably from 50° C. to 120° C., and more preferably from 60° C. to 110° C.

As a heating means, the means used in step (b) can be used. There are no particular limitations on the timing of this additional heating so long as it is carried out after the step (b), but may preferably be carried out simultaneously with the whole areal exposure or thereafter.

Methods for making visible and forming into a color image the polymer image formed through the steps (a) to (c) in the method (1) or (2) of the present invention have hitherto proposed in variety, and all those hitherto known methods can be applied also in the present invention to obtain a visible image and a color image which have a sufficient contrast. In particular, however, the peeling-apart and the inking are suitable in view of their simplicity and their capability of making the resulting image highly detailed.

The peeling-apart and inking used in the image forming method of the present invention will be described below in detail.

Figure 3:
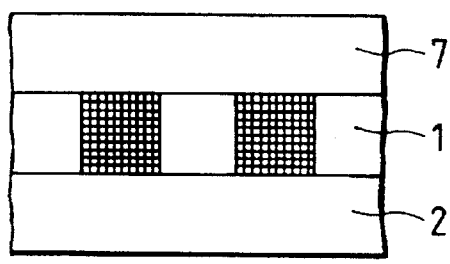
Figure 3:
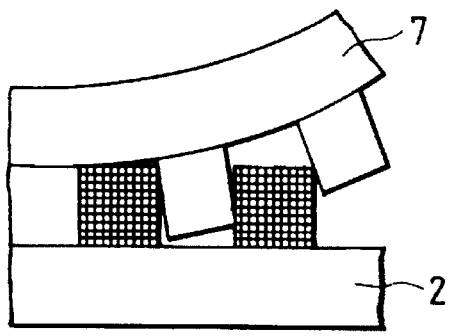

In the polymerized area of the photosensitive material having been subjected to the steps (a) to (c) of the image forming method (1) or (2) of the present invention, differences in physical properties have been caused in accordance with a difference in its polymerization degree, or a difference in its cross-linking degree when the polyfunctional polymerizable polymer precursor has been employed. The differences in physical properties refer to differences in surface energy such as surface tension, wettability, etc. and differences in stickiness, adhesion, etc., on the surface of the photosensitive material. Hence, utilizing such differences in physical properties, firstly the polymer image can be made visible by the peeling-apart [FIG. 3, (d1)]. More specifically, a transferring medium 7 is laminated as illustrated in FIG. 3 (the upper), and the transferring medium 7 is peeled as illustrated also in FIG. 3 (the lower). As a result, the polymer image is selectively transferred, and thus a positive image or negative image having a good resolution can be obtained. The image thus obtained is the image on the transferring medium 7 or the image on a support 2.

In step (d1), the transferring medium 7 may include, for example, art paper, coated paper, films, and metal foil. Heating is not necessarily required in the transfer, but the transfer may preferably be carried out by heating the photosensitive material and the transferring medium to about 40° to 150° C. It may also desirably be carried out by applying pressure of from 1 kg/cm² to 400 kg/cm², and preferably from 10 kg/cm² to 150 kg/cm².

When taking note only of the step of forming the image by the adhesion transfer as in this (d1), such a procedure is disclosed in Japanese Patent Publication No. 38-9663, Japanese Unexamined Patent Publication No. 49-32640, etc. However, the methods of the present invention can be a method superior to the one disclosed in these publications in view of photosensitivity, photosensitive wavelength regions, processing speed, and capability of image processing.

If the photosensitive layer of the photosensitive material is previously colored with pigments or dyes, a color image can be formed by the above peeling-apart.

Figure 4:
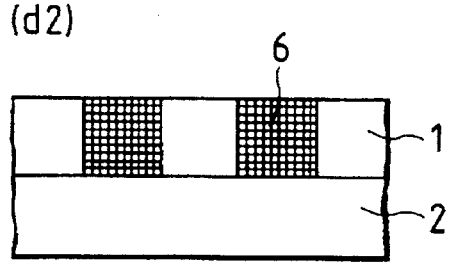
Figure 4:
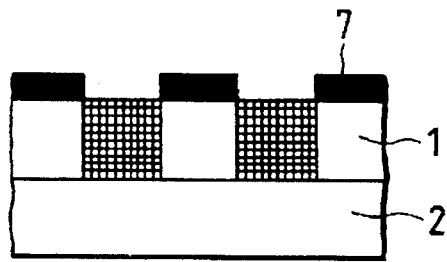

Next, the polymer image formed through the steps (a) to (c) of the image forming method (1) or (2) of the present invention can be formed into a color image by the inking [FIG. 4, (d2)]. More specifically, as illustrated in FIG. 4, feeding a color developer to a photosensitive layer 1 brings about a distribution pattern formed of the part to which the color developer adheres and the part to which it does not adhere, corresponding to the differences in physical properties.

In FIG. 4, the polymer image formed in step (c) was used in step (d2) as it is, but the method of the present invention is by no means limited to this example. For example, after step (c), an unpolymerized area of the polymer image may be etched and thereafter, in step (d2), the color developer may be fed to the resulting polymer image.

In the method of the present invention, the embodiment in which the polymer image is not etched is advantageous in that the process can be simplified or that the process can be carried out under perfectly dry conditions, and particularly advantageous when a powdery material or the like is used as a color developer. Also, the embodiment in which the polymer image is etched is advantageous in that the contrast can be improved and the generation of fog can be reduced, and particularly advantageous when an ink or the like is used as a color developer. An embodiment in which the peeling-apart (d1) is carried out in place of the etching and thereafter a color developer is fed in step (d2) can enjoy the advantage that the process can be carried out under perfectly dry conditions, the contrast can be improved, and the generation of ground fog can be reduced.

There are no particular limitations on the color developer to be used so long as the distribution pattern of the color developer can be formed corresponding to the polymer image, and, for example, it may be appropriately selected depending on the surface properties of the polymer image. It may include, for example, powdery materials such as dye and pigment, and lipophilic or hydrophilic inks.

The dye and pigment may include inorganic or organic pigments as exemplified by titanium oxide, carbon black, bronze powder, diazo yellow, and phthalocyanine blue. Powdery materials obtained by dispersing the dye and pigment or a metal powder in a polymeric compound as exemplified by polystyrene can also be used as powdery color developers other than the dye and pigment. The above dye and pigment and other powdery color developers may desirably have an average particle diameter of from 0.1 μm to 20 μm, and preferably from 1 μm to 5 μm.

The lipophilic ink is an ink containing any desired dye and pigment or the like as described above, and comprised of any desired oil, resin, plasticizer, etc. The oil may include vegetable oils, processed oils, and mineral oils. The resin may include natural resins such as rosin and shellac, and synthetic resins of phenol type, ketone type, etc. Preferred as the solvent is a solvent having an appropriate dissolving power and diluting power with respect to the resin contained in the ink, having a desired evaporation rate, and capable of imparting a required viscosity and fluidity to the whole ink. A variety of solvents can be used as such a solvent, as exemplified by aliphatic hydrocarbons such as n-hexane, aromatic hydrocarbons such as cyclohexane and toluene, esters such as methyl acetate and ethyl acetate, alcohols such as methyl alcohol and ethyl alcohol, ketones such as acetone and methyl ethyl ketone, glycols such as ethylene glycol, propylene glycol and dipropylene glycol, glycol ethers, and glycol ether esters. These can also be used by mixing any of them in adaptation to any desired performances. The plasticizer imparts flexibility, softness and cold resistance to a dried film of the ink, and used are phthalates such as dibutyl phthalate and dioctyl phthalate, esters of adipic acid, citric acid, etc., paraffin chloride, castor oil, epoxy plasticizers, polyester plasticizer, and so forth.

The hydrophilic ink is a water-soluble ink containing any desired dye and pigment or the like as described above, and containing a water-soluble polymer as exemplified by polyvinyl alcohol, polyvinyl pyrrolidone and polyacrylamide, an additive as exemplified by surface active agents, and water as a solvent.

There are no particular limitations on the manner by which the color developer is fed, but in the case where the powdery color developer is fed, it is preferred to carry out developing using, for example, a fur brush, a magnetic brush, or a cascade. In the case where the color developer of ink type is fed, it is preferred to carry out developing using a blade, inking roller or the like.

The color image that can be obtained using the color developers as described above can be used as a color image as it is. Also, using the polymer image as a sort of printing plate, any desired color image can be obtained by transferring the color developer on the polymer image to another medium.

In the case where the color image obtained by feeding the color developer on the polymer image is kept as an image as it is, a step to fix the color developer may preferably be taken. The fixing step includes, for example, a step of applying near ultraviolet rays to completely solidify the unpolymerized area, and a step of forming a thin layer film by laminating or coating.

On the other hand, in the case where the color image is formed by feeding the color developer on the polymer image (on a plate on which the polymerized area and unpolymerized area coexist, or a relief comprised only of the polymerized area) and then transferring it on paper or the like to form a color image thereon, the color image can be continuously formed on many sheets of paper by, for example, carrying out offset inking, using the polymer image as the plate.

The image forming methods of the present invention, described above in detail, can obtain a good visible image and a good color image, which have superior resolution and may suffer no or less color fogging.

The present invention will be described below in greater detail by giving Examples.

EXAMPLE 1

In 10 parts of isopropanol in which 0.8 part of polyvinyl butyral was dissolved, 0.1 part of AgBr and 0.6 part of silver behenate were dispersed. Subsequently 0.29 part of 4-methoxy-1-naphthol was dissolved in this solution to obtain Solution A. Separately therefrom, 0.15 part of 2-chlorothioxanthone, 0.18 part of ethyl p-dimethylaminobenzoate, 0.6 part of polymethyl methacrylate and 1.8 parts of pentaerythritol triacrylate were dissolved in 15 parts of methyl ethyl ketone to obtain Solution B.

Next, Solution A was throughly mixed with Solution B, and the mixture was coated on a 12 μm thick PET film so as to give a dried film thickness of 2 μm to provide a photosensitive layer, and a 2 μm thick PVA layer was provided thereon.

Next, on the PVA layer of the resulting photosensitive material, a mask film was overlapped to carry out latent image formation.

Using as a light source a fluorescent lamp having a fluorescent peak at 420 nm and a luminous output of 5 mW, exposure to light was carried out for 10 msec with the light source made distant 5 cm from the photosensitive material.

Thereafter the mask film was removed, and the photosensitive material was allowed to pass in 20 seconds through a heat developing machine adjusted to 105° C. Then the photosensitive material was placed on a hot plate heated to 60° C., and light from a fluorescent lamp having a fluorescent peak at 390 nm and a luminous output of 10 mW was applied thereon for 10 seconds with a distance of 5 cm.

As a final procedure, the PVA film was removed by washing with water and thereafter the photosensitive material was rinsed in ethanol. As a result, imagewise exposed areas were removed from the PET film, and a sharp positive image comprised of polymer areas remained on the PET film.

The above processing was carried out under safe light throughout the procedures.

EXAMPLE 2

Example 1 was repeated to obtain a photosensitive material protected with the PVA layer, except that 0.6 part of silver behenate was replaced with 0.4 part of silver benzotriazole.

Then, after the latent image was formed in the same manner as Example 1, the photosensitive material was allowed to pass in 20 seconds through a heat developing machine adjusted to 120° C. Subsequently, the whole areal exposure was carried out, and the washing with water and the treatment with ethanol were carried out. As a result, a sharp polymer positive image was obtained on the PET film.

In an instance where the whole areal exposure was not carried out in the polymerization step, no polymer image was formed. Also in an instance where the heating temperature was raised, no polymer image was formed.

EXAMPLE 3

In 10 parts of ethanol, 0.2 part of AgBrI, 0.5 part of silver behenate and 0.25 part of 4,8-dihydroxyquinoline-2-carboxylic acid were dispersed and dissolved to make up Solution A.

Separately from the above, 1.0 part of polymethyl methacrylate, 2.7 parts of epoxy actylate (V5502, a product of Dainippon Ink a Chemicals, Inc.) as a polymerizable polymer precursor, 0.26 part of Michler's ketone and 0.1 part of Kayaset Red K-BL were dissolved in 10 parts of methyl ethyl ketone to make up Solution B.

Next, Solution A was throughly mixed with Solution B, and the mixture was coated on a 25 μm thick PET film using an applicator so as to give a dried film thickness of 5 μm to provide a photosensitive layer, and a 2 μm thick PVA layer was further provided thereon.

On the PVA layer of the resulting photosensitive material, a mask film was overlapped, and light from a 420 nm, 10 mW fluorescent lamp was applied thereon for 20 msec with a distance of 5 cm, to form a latent image.

Thereafter, the photosensitive material was allowed pass in 20 seconds through a heat developing machine adjusted to 120° C., and light from a 335 nm, 10 mW fluorescent lamp was applied on the whole surface for 5 seconds with a distance of 3 cm, followed by removal of the PVA layer by washing with water, and then rinsing of the photosensitive material in methyl ethyl ketone, to carry out fixing. A sharp reddish-brown polymer positive image was obtained on the PET film.

COMPARATIVE EXAMPLE 1

Example 3 was repeated to prepare a photosensitive material protected with the PVA layer, except that 0.25 part of 4,8-dihydroxyquinoline-2-carboxylic acid was replaced with 0.3 part of phenidone and Michler's Ketone was replaced with azobisisobutyronitrile.

On the resulting photosensitive material, a latent image was formed in the same manner as Example 3, which photosensitive material was then allowed to pass through a heat developing machine and heated under the same heating conditions as Example 3.

After the heating was completed, the PVA layer was removed by washing with water, and thereafter the photosensitive material was rinsed with methyl ethyl ketone, but all the photosensitive material was dissolved away from the PET substrate, so that it was unable to obtain any polymer image. Further, even when the time for the photosensitive material to pass through the heat developing machine was prolonged from 20 seconds to 60 seconds, no polymer image was obtained, but when it was prolonged to 80 seconds, the whole surface was polymerized without any area dissolved out.

EXAMPLE 4

Example 1 was repeated to prepare a photosensitive material, except that 0.29 part of 4-methoxy-1-naphthol was replaced with 0.43 part of 2,2'-methylenebis (4-methoxyphenol).

The imagewise exposure, heat developing, whole areal exposure, and etching were carried out in the same manner as Example 1 except that the heat developing machine was adjusted to 115° C., thus obtaining a polymer image.

EXAMPLE 5

A solution having the following composition was prepared in the same manner as Example 1.

| Solution A: | |
|---|---|
| Behenic acid | 2 parts |
| Silver bromide | 0.2 part |
| Silver behenate | 2.5 parts |
| 2-Methylresorcinol | 0.1 part |
| Ethanol | 20 parts |
| Toluene | 30 parts |
| Solution B: | |
| Acrylic monomer (HSP-1000, manufactured by Nippon Oil Fats Co., Ltd) | 25 parts |
| 1-Diethylaminoanthrahydroquinone monomethyl ether | 1.4 parts |
| Toluene | 20 parts |

In the same manner as Example 1, mixed solution of Solution A with Solution B was coated on a polyethylene terephthalate film to give a thickness of m, and further thereon a PVA film was provided. After imagewise exposure and heating were carried out in the same manner as Example 1, the photosensitive material was subjected to whole areal exposure for 1 second using the fluorescent lamp used in the latent image formation, while heating it on a hot plate of 70° C. After washing with water, uncured areas were removed with use of a developing liquid.

A polymer image remained on the support. The same operation as above was repeated several times, but with the polymerized areas kept unchanged, showing the reproducibility.

COMPARATIVE EXAMPLE 2

Example 5 was repeated to prepare a photosensitive material, except that 1-diethylaminoanthrahydroquinone monomethyl ether was removed and 0.1 part of 2-methylresorcinol was replaced with 0.7 part of the same.

After a latent image was formed thereon in the same manner as Example 1, the photosensitive material was allowed to pass through a heat developing machine to carry out heating under conditions of 130° C. and 20 sec. A black image was formed on the exposed areas. This was immersed in an ethanol solvent to carry out etching, whereupon the photosensitive material was all dissolved out and no image remained on the support.

A latent image was also written on the same photosensitive material under the same conditions as above, followed by heating, and thereafter the whole areal exposure using a high-pressure mercury lamp was carried out under the same conditions as Example 1, but still obtaining the same results. No image remained on the support.

EXAMPLE 6

In a darkroom, 59 parts of xylene, 56 parts of n-butanol and 2 parts of behenic acid were dissolved, and 5 parts of silver behenate was mixed and added in the solution, which was dispersed using a homomixer, at 5,000 rpm for 10 minutes.

To the resulting dispersion, 1 part of silver bromide and 3 parts of polymethyl methacrylate were added, and the mixture was stirred for 1 hour. Thereafter 21 parts of Unidic 16-824 (manufactured by Dainippon Ink & Chemicals, Inc.), 1.3 parts of chlorothioxanthone, 0.6 part of p-dimethylaminobenzoic acid and 1.5 parts of Foron Brilliant Scarlet SRG (available from Sandoz Co.) were successively added, followed by heating to 35° C. and stirring for 30 minutes. After the resulting mixture was left to cool, 0.7 part of 4-methoxynaphthol was added thereto, thus completing the preparation of an emulsion.

The above emulsion was coated on an aluminum-deposited polyethylene terephthalate film (available from Panac Kogyo Co.) using an applicator to Give a dried film thickness of 4 μm. A transparent polyethylene terephthalate film was laminated thereon to obtain a photosensitive material.

A mask was laid on the photosensitive material thus prepared, which was then exposed to light to form a latent image.

Using as a light source a fluorescent lamp having a fluorescent peak at 420 nm and a luminous output of 10 mW, exposure to light was carried out for 1 second with the light source made distant 5 cm from the photosensitive material.

Thereafter the mask film was removed, and the photosensitive material was allowed to pass through a heat developing machine adjusted to 100° C. Then the photosensitive material was placed on a hot plate heated to 60° C., and light from a fluorescent lamp having a fluorescent peak at 350 nm and a luminous output of 10 mW was applied thereon for 20 seconds with a distance of 5 cm.

While this was allowed to pass between rollers heated to 60° C. and applied with a pressure of 25 kg/cm² the transparent polyethylene terephthalate film was peeled. As result, a red negative image was formed on the transparent film.

EXAMPLE 7

In 20 parts of ethanol and 30 parts of chloroform, 1.7 parts of behenic acid were dissolved, and thereafter 2 parts of silver behenate was added to the solution, which was dispersed using a homogenizer, at 5,000 rpm for 10 minutes, to which 0.3 part of silver bromide was further added to carry out dispersion for 5 minutes. Subsequently 0.5 part of phthalazinone and 0.6 part of β-acetylphenylhydrazine were added, and stirring was continued at 30° C. for 30 minutes, thus preparing Solution A.

Separately from the above, prepared was Solution B obtained by dissolving 7 parts of polymethyl methacrylate, 15 parts of a trimethylolpropane triacrytate, 5 parts of pentaerythritol triacrylate, 0.9 part of 1,4-hydroxyanthrahydroquinone and 0.6 part of ethyl p-diethylaminobenzoate in 75 parts of chloroform.

After the above two solutions were mixed, the mixture was coated on a titanium oxide-compounded polyethylene terephthalate film of 75 µm thick with a Meyer bar to provide a photosensitive layer with a thickness of 4 µm. A PVA film with a thickness of 2 µm was provided thereby.

A mask was laid on the photosensitive material thus prepared, which was then exposed to light.

Using as a light source a fluorescent lamp having a fluorescent peak at 360 nm and an output of 10 mW, exposure to light was carried out for 100 msec. with the light source made-distant 3 cm. Thereafter the mask was removed, and the photosensitive material was allowed to pass through a heat developing machine adjusted to 120° C., followed by whole areal exposure for 10 seconds using an ultraviolet-light irradiator comprising a high-pressure mercury lamp, with a distance of 2.5 m therefrom. After the PVA film was removed by washing with water, a plain paper was overlapped on the photosensitive layer, which were heated to 80° C., and peeled after they were allowed to pass between rollers heated to 80° C. and applied with pressure of 25 kg/cm². The photosensitive layer at the unexposed areas was transferred on the plain paper.

EXAMPLE 8

| | |
|---|---|
| AgBr | 0.1 part |
| Silver behenate | 0.7 part |
| Isopropyl alcohol | 10 parts |
| 6-Benzyl-4-methoxy-1-naphthol | 0.42 part |
| Methyl methacrylate/butyl acrylate copolymer | 2.0 parts |
| Trimethylolpropane triacrylate | 2.0 parts |
| 7-Methoxy-3-benzoylcoumarin | 0.16 part |
| Ethyl-4-dimethylaminobenzoate | 0.04 part |

A solution having the above composition was thoroughly dispersed and mixed using a disperser to prepare an emulsion. Next, the emulsion was coated on a 50 µm thick polyester film using an applicator, followed by drying to form a photosensitive layer with a thickness of 5 µm. Subsequently, on that layer, a polyester film with a thickness of 12 µm was laminated. Then, on the photosensitive layer, imagewise irradiation was made for 10 seconds using as a light source a tungsten daylight light source. Next, heating was carried out at 120° C. for 8 seconds to effect thermal amplification of the resulting silver halide latent image. Subsequently, an ultraviolet fluorescent lamp was used to carry out whole areal exposure for 60 seconds. Thereafter, the polyester film on the photosensitive layer was peeled, and developing was made with use of carbon black and a fur brush. As a result, the carbon black was adhered on the exposed areas and was not adhered on the unexposed areas, and thus it was able to form a black pattern having a superior resolution.

EXAMPLE 9

| | |
|---|---|
| AgBr | 0.1 part |
| Silver behenate | 0.7 part |
| Isopropyl alcohol/toluene (1/1) | 15 parts |
| 4-benzyloxy-1-naphthol | 0.4 parts |
| Polystyrene | 3.0 parts |
| Trimethylolpropane triacrylate | 1.0 parts |
| 7-Methoxy-3-benzoylcoumarin | 0.16 part |
| Ethyl-4-dimethylaminobenzoate | 0.04 part |

A solution having the above composition was thoroughly dispersed and mixed using a disperser to prepare an emulsion. Next, the emulsion was coated using a bar coater on a film formed by Al deposition (1,000Å) on a 50 µm thick polyester film, followed by drying to form a photosensitive layer, and thereafter a polyester film with a thickness of 50 µm was laminated. Then, on the photosensitive layer, imagewise irradiation was made for 5 seconds with light of about 400 nm or more through a cut filter (Y-42, available from Toshiba Glass Co., Ltd.), using as a light source a high-pressure mercury lamp (VSH-500D, a manufacture by Ushio Inc.). Next, heating was carried out at 115° C. for 10 seconds to effect thermal amplification of the resulting silver halide latent image. Subsequently, the above filter was removed to carry out irradiation for 20 seconds. Thereafter, the polyester film on the photosensitive layer was peeled, and the unchred, exposed areas were completely removed by etching. As a result, there was made a plate comprising the Al-deposited polyester film formed thereon with cured, unexposed areas and Al surfaces exposed by removal of imagewise exposed areas. This film was mounted on a drum-like printer (manufactured by Gestetner AG) to carry out printing using an offset ink (CM Ace Black, available from Miyako Ink Co.). As a result, there were obtained black images at a rate of 100 sheets per minute. The resulting offset images had a superior resolution and were free of any color fog.

EXAMPLE 10

A solution having the same formulation as Example 9 was thoroughly dispersed and mixed using a disperser to prepare an emulsion. Next, this emulsion was coated on a 50 µm thick polyester film using an applicator to form a photosensitive layer with a thickness of 5 µm. Subsequently, on that layer, a polyester film with a thickness of 12 µm was laminated. Then, on the photosensitive layer, imagewise irradiation was made for 10 seconds using as a light source a tungsten daylight light source. Next, heating was carried out at 120° C. for 8 seconds to effect thermal amplification of the resulting silver halide latent image. Subsequently, an ultraviolet fluorescent lamp was used to carry out whole areal exposure for 60 seconds. Thereafter, the polyester film on the photosensitive layer was peeled, and an ink sheet was laminated. The ink sheet was the one formed by coating on a polyester film of 50 µm thick a hot melt ink obtained by melting and dispersing 15 parts of carbon black, 40 parts of carnauba wax, 35 parts of polyethylene oxide and 10 parts of ethylene/vinyl acetate resin (ethylene 85% MI 40). Thereafter, heat was applied to the above both sheets, which were then peeled. As a result, ink was adhered only on the exposed areas and thus it was able to form a black pattern having a superior resolution.

EXAMPLE 11

In 20 parts of ethanol and 30 parts of chloroform, 1.7 parts of behenic acid were dissolved, and thereafter 2 parts of silver behenate was added to the solution, which were dispersed using a homogenizer, at 5,000 rpm for 10 minutes, to which 0.3 part of silver bromide was further added to carry out dispersion for 5 minutes. Subsequently 0.5 part of phthaladinone and 0.6 part of β-acetylphenylhydrazine were added, and stirring was continued at 80° C. for 30 minutes, thus preparing Solution A.

Separately from the above, prepared was Solution B obtained by dissolving 7 parts of polymethyl methacrylate, 15 parts of trimethylolpropane triacrylate, 5 parts of a pentaerythritol triacrylate, 1.2 parts of 2-ethylanthrahydroquinone monopropyl ether and 0.2 part of ethyl p-diethylaminobenzoate in 75 parts of chloroform.

After the above two solutions were mixed, the mixture was coated on a titanium-treated polyethylene terephthalate film of 75 µm thick with a Meyer bar to provide a photosensitive layer with a thickness of 4 µm. A PVA film with a thickness of 2 µm was provided thereon.

A mask was laid on the photosensitive material thus prepared, which was then exposed to light.

Using as a light source a fluorescent lamp having a fluorescent peak at 390 nm and an output of 10 mW, exposure to light was carried out for 100 msec with the light source made distant 5 cm. Thereafter the mask was removed, and the photosensitive material was allowed to pass through a heat developing machine adjusted to 120° C., followed by whole areal exposure for 10 seconds using an ultraviolet-light irradiator comprising a high-pressure mercury lamp, with a distance of 2.5 m therefrom. After the PVA film was removed by washing with water, the photosensitive material was immersed in a chloroform/ethanol mixed solvent and applied with ultrasonic waves for 3 minutes. The above were all operated in a darkroom. A brown-colored polymer image of silver was formed on the support.

Subsequently, after etching, this film was mounted on a light-duty printer (manufactured by Gestetner AG) to carry out offset inking with use of LK 500 (available from Toyo Ink Mfg. Co., Ltd.), thus obtaining good black images at a rate of 100 sheets per minute.

COMPARATIVE EXAMPLE 3

Example 1 was repeated to obtain a photosensitive material, except that 0.29 part of 4-methoxy-1-naphthol was replaced with 0.3 part of phenidone.

The imagewise exposure, heat developing; and whole areal exposure were carried out in the same manner as Example 1 except that the heat developing machine was adjusted to 120° C. As a result, no polymer image was formed. Also, the whole surface was polymerized when the whole areal exposure time was 30 seconds or more.

We claim:

1. A photosensitive composition, comprising: (a) a photosensitive and heat-developable element, wherein said photosensitive and heat-developable element comprises:

(i) an organic silver salt, (ii) a photosensitive silver halide, (iii) at least one compound selected from the group of compounds consisting of one of Formula (I), (II), and (III):

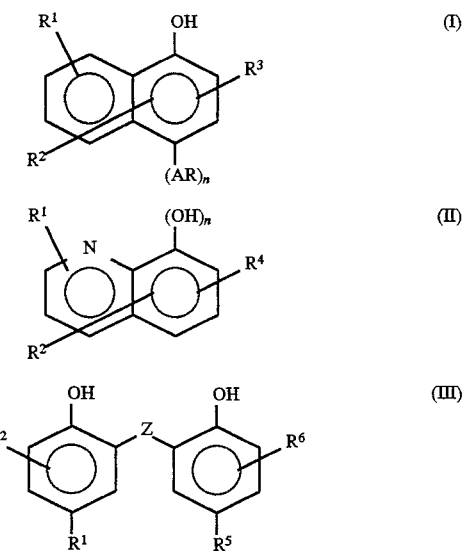

wherein $R^1$, $R^2$, $R^3$, $R^5$, and $R^6$, each represent a hydrogen atom, a halogen atom, a hydroxyl group, a substituted or unsubstituted alkyl group, a substituted or unsubstituted aralkyl group, a substituted or unsubstituted aryl group, an alkoxy group, or a substituted or unsubstituted cycloalkyl group, $R^4$ represents a hydrogen atom, a halogen atom, a substituted or unsubstituted alkyl group, a substituted aryl group, a substituted or unsubstituted cycloalkyl group, a carboxyl group, or a carboxylic acid ester group, A represents an oxygen atom, or a sulfur atom; R represents a hydrogen atom, an unsubstituted alkyl group, or a substituted or unsubstituted aralkyl group, n represents 0 or 1; and Z is a divalent linking group and represents an alkylidene group, an aralkyl group, or a sulfur atom; and (b) a photopolymerizable element, wherein said polymerizable element comprises at least:

(iv) a polymerizable polymer precursor having at least one reactive vinyl group, and (v) a photopolymerization initiator, wherein said photopolymerization initiator is a carbonyl compound selected from the group consisting of a diketone, a benzophenone, an acetophenone, a benzoin alkyl ether, a thioxanthone, a chalcone, a styrylketone and a coumarin;

wherein said composition is subjected to imagewise exposure and heating to form silver metal on the imagewise exposed area thereof, then subjected to whole areal exposure to polymerize an area of the photosensitive material where metal silver is not formed.

2. The photosensitive composition according to claim 1, wherein said silver halide is contained in an amount of from 0.05 mol to 0.4 mol per mol of the organic silver salt.

3. The photosensitive composition according to claim 1, wherein said compound selected from the group consisting of Formula (I), (II) and (III) is contained in an amount of from 0.4 mol to 1.3 mols per mol of the organic silver salt.

4. The photosensitive composition according to claim 1, wherein said photopolymerization initiator is contained in an amount of from 0.1% by weight to 50% by weight based on the polymerizable polymer precursor.

5. The photosensitive composition according to claim 1, wherein said photopolymerization initiator is contained in an amount of from 0.5% by weight to 30% by weight based on the polymerizable polymer precursor.

6. The photosensitive composition according to claim 1, wherein said photopolymerization initiator is contained in an amount of from 0.1 mol to 3 mols per mol of the compound selected from the group consisting of Formula (I), (II) and (III).

7. The photosensitive composition according to claim 1, wherein said photosensitive composition contains a binder resin.

8. A photosensitive material, comprising the photosensitive composition according to claim 1, formed in the shape of a film.

9. The photosensitive material according to claim 8, wherein said photosensitive material has a dried film thickness of 0.1 μm to 2 mm.

10. The photosensitive material according to claim 8, wherein said photosensitive material has a dried film thickness of 1 μm to 0.1 mm.

11. An image forming method comprising the steps of:
(i) subjecting a photosensitive material according to claim 8 to imagewise exposure and first heating; and
(ii) thereafter subjecting the first heated photosensitive material to whole areal exposure and second heating to form a polymer image.

12. The image forming method according to claim 11, wherein said second heating is carried out simultaneously with the whole areal exposure or thereafter.

13. The image forming method according to claim 11, wherein the temperature of the photosensitive material heated in the second heating is lower than the temperature of the photosensitive material heated in the first heating.

14. The image forming method according to claim 11, wherein said second heating is carried out at a temperature lower than that in the first heating.

15. The image forming method according to claim 11, wherein said second heating is carried out at a temperature of from 40° C. to 150° C.

16. The image forming method according to claim 11, wherein said first heating is carried out simultaneously with the imagewise exposure or thereafter.

17. The image forming method according to claim 11, wherein said second heating is whole areal heating.

18. The image forming method according to claim 11, comprising the step of separating said imagewise exposed area and imagewise unexposed area, after said formation of the polymer image.

19. The image forming method according to claim 11, further comprising the step of applying a color developer to said imagewise exposed area, after said formation of the polymer image.

20. An image forming method, comprising the steps of:
(i) subjecting a photosensitive material containing a photosensitive and heat-developable element and a photopolymerizable element in the same layer to imagewise exposure and heating, said photosensitive and heat-developable element comprising at least a photosensitive silver halide, an organic silver salt, and a reducing agent and said photopolymerizable element comprising at least a polymerizable polymer precursor having at least one reactive vinyl group and a photopolymerization initiator, wherein said photopolymerization initiator is a carbonyl compound selected from the group consisting of a diketone, a benzophenone, an acetophenone, a benzoin alkyl ether, a thioxanthone, a chalcone, a styrylketone and a coumarin, in order to form an imagewise exposed area containing an oxidized product of said reducing agent and a non-exposed area containing said reducing agent on the photosensitive material, wherein said reducing agent is at least one compound selected from the group of compounds consisting of one of Formula (I), (II) and (III):

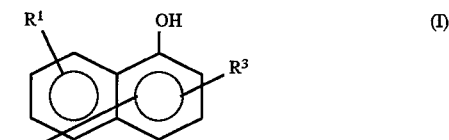

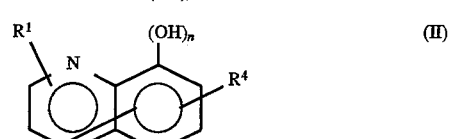

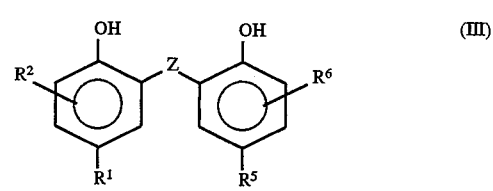

wherein $R^1$, $R^2$, $R^3$, $R^5$ and $R^6$ each represent a hydrogen atom, a halogen atom, a hydroxyl group, a substituted or unsubstituted alkyl group, a substituted or unsubstituted aralkyl group, a substituted or unsubstituted aryl group, an alkoxy group, or a substituted or unsubstituted cycloalkyl group; $R^4$ represents a hydrogen atom, a halogen atom, a substituted or unsubstituted alkyl group, a substituted or unsubstituted aryl group, a substituted or unsubstituted cycloalkyl group, a carboxyl group, or a carboxylic acid ester group, A represents an oxygen atom, or a sulfur atom; R represents a hydrogen atom, an unsubstituted alkyl group, or a substituted or unsubstituted aralkyl group; n represents 0 or 1; and Z is a divalent linking group and represents an alkylidene group, an aralkylidene group, or sulfur atom; and (ii) subjecting the heated photosensitive material to whole areal exposure to polymerize the area containing said reducing agent, wherein said area containing said reducing agent is polymerized to a greater extent than said exposed area containing oxidized product of said reducing agent.

21. The image forming method according to claim 20, wherein said heating is carried out simultaneously with the imagewise exposure or thereafter.

22. The image forming method according to claim 20, further comprising the step of separating said imagewise exposed area and imagewise unexposed area, after said formation of the polymer image.

23. The image forming method according to claim 20, comprising the step of applying a color developer to said imagewise exposed area, after said formation of the polymer image.

24. The image forming method according to claim 20, wherein said reducing agent is contained in an amount of from 0.4 mol to 1.3 mols per mol of the organic silver salt.

25. The image forming method according to claim 20, wherein said photopolymerization initiator is contained in an amount of from 0.1 mol to 3 mols per mol of the reducing agent.

* * * * *

UNITED STATES PATENT AND TRADEMARK OFFICE
CERTIFICATE OF CORRECTION

PATENT NO. : 5,663,032

DATED : September 2, 1997

INVENTOR(S): TETSURO FUKUI ET AL.

Page 1 of 3

It is certified that error appears in the above-identified patent and that said Letters Patent is hereby corrected as shown below:

ON TITLE PAGE AT [56] REFERENCES CITED, FOREIGN PATENT DOCUMENTS
 "3207064  2/1981  Germany" should be deleted.

COLUMN 2
 Line 1, "reduced" should read --reducing--;
 Line 21, "has" should read --has the--;
 Line 50, "efficiency" should read --efficiently--;
 Line 54, "to" should be deleted".

COLUMN 3
 Line 13, "in one," should read --, in one--;
 Line 17, "method" should read --method in--.

COLUMN 5
 Line 25, "steps" should read --steps of;--.

COLUMN 6
 Line 17, "is" should read --as--.

COLUMN 8
 Line 29, "cbmpounds" should read --compounds--.

COLUMN 9
 Line 40, "ether.," should read --ether,--;
 Line 47, "glutsrate," should read --glutarate,--;
 Line 63, "monomers" should read --monomers as--.

UNITED STATES PATENT AND TRADEMARK OFFICE
CERTIFICATE OF CORRECTION

PATENT NO. : 5,663,032

DATED : September 2, 1997

INVENTOR(S): TETSURO FUKUI ET AL.

It is certified that error appears in the above-identified patent and that said Letters Patent is hereby corrected as shown below:

COLUMN 10
Line 17, "carbonylbis(7-" should read
---3,3'-carbonylbis(7---;
Line 52, "mol;" should read 1.3 mol;--.

COLUMN 13
Line 55, "a-polymer" should read --a polymer--.

COLUMN 14
Line 37, "times" should read --time--;
Line 53, "cleane" should read --clean--.

COLUMN 15
Line 19, "in a" should read --with--;
Line 46, "to to " should read --to--.

COLUMN 17
Line 1, "may" should read --may be--.

COLUMN 20
Line 55, "allowed" should read --allowed to--.

COLUMN 22
Line 38, "Give" should read --give--.

COLUMN 23
Line 17, "thereby." should read --thereon--;
Line 24, "Made-distant" should read --mode-distant--.

UNITED STATES PATENT AND TRADEMARK OFFICE
CERTIFICATE OF CORRECTION

PATENT NO. : 5,663,032

DATED : September 2, 1997

INVENTOR(S): TETSURO FUKUI ET AL.

It is certified that error appears in the above-identified patent and that said Letters Patent is hereby corrected as shown below:

COLUMN 24
Line 28, "unchred." should read --uncured--.

COLUMN 25
Line 6, "80°C." should read --30°C.--;
Line 51, "developing;" should read --developing,--.

Signed and Sealed this

Twenty-first Day of July, 1998

Attest:

BRUCE LEHMAN

Attesting Officer     Commissioner of Patents and Trademarks